(12) United States Patent
Chung et al.

(10) Patent No.: US 9,954,099 B1
(45) Date of Patent: *Apr. 24, 2018

(54) TRANSISTOR STRUCTURE

(71) Applicant: United Microelectronics Corp., Hsinchu (TW)

(72) Inventors: Cheng-Hsun Chung, Hsinchu County (TW); Shih-Teng Huang, Taichung (TW); Tien-Shang Kuo, Taoyuan (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/631,820

(22) Filed: Jun. 23, 2017

Related U.S. Application Data

(63) Continuation of application No. 15/299,268, filed on Oct. 20, 2016, now Pat. No. 9,741,826.

(51) Int. Cl.
| | |
|---|---|
| *H01L 29/66* | (2006.01) |
| *H01L 21/00* | (2006.01) |
| *H01L 29/78* | (2006.01) |
| *H01L 29/49* | (2006.01) |
| *H01L 29/51* | (2006.01) |
| *H01L 29/36* | (2006.01) |
| *H01L 23/535* | (2006.01) |
| *H01L 21/768* | (2006.01) |
| *H01L 21/285* | (2006.01) |

(52) U.S. Cl.
CPC ........ *H01L 29/7816* (2013.01); *H01L 21/285* (2013.01); *H01L 21/76895* (2013.01); *H01L 23/535* (2013.01); *H01L 29/36* (2013.01); *H01L 29/4983* (2013.01); *H01L 29/512* (2013.01)

(58) Field of Classification Search
CPC ..................... H01L 29/7824; H01L 29/66681
USPC ................. 438/156, 173, 192; 257/328, 335
See application file for complete search history.

(56) References Cited

U.S. PATENT DOCUMENTS

| | | | |
|---|---|---|---|
| 8,575,692 B2 | 11/2013 | Yang | |
| 8,878,275 B2 | 11/2014 | Kim et al. | |
| 9,741,826 B1 * | 8/2017 | Chung | ............. H01L 29/66681 257/328 |

* cited by examiner

*Primary Examiner* — Calvin Lee
(74) *Attorney, Agent, or Firm* — J.C. Patents

(57) ABSTRACT

A transistor structure including a gate, a first dielectric layer, a first contact and a second contact is provided. The gate is disposed on a substrate. The first dielectric layer is disposed on the substrate. The first dielectric layer covers a portion of a top surface of the gate. The first contact is electrically connected to the gate. The second contact is disposed on the first dielectric layer. The second contact is electrically connected with the first contact.

16 Claims, 2 Drawing Sheets

TRANSISTOR STRUCTURE

CROSS REFERENCE TO RELATED APPLICATION

This application is a continuation application of and claims the priority benefit of U.S. application Ser. No. 15/299,268, filed on Oct. 20, 2016, now U.S. Pat. No. 9,741,826 issued on Aug. 22, 2017. The entirety of the above-mentioned patent application is hereby incorporated by reference herein and made a part of specification.

BACKGROUND OF THE INVENTION

Field of the Invention

The invention relates to a semiconductor device, and particularly relates to a transistor structure.

Description of Related Art

The high voltage transistor device (such as lateral diffused metal-oxide semiconductor (LDMOS) etc.) is broadly applied to various integrated circuits (ICs). However, the charge and the electric field is easy to concentrate at the sharp edge or the sharp point of the high voltage transistor device, and thus the leakage current is occurred and the electrical performance is reduced.

SUMMARY OF THE INVENTION

The invention provides a transistor structure, wherein the leakage current of the transistor structure can be inhibited and the transistor structure can have the superior electrical performance.

The invention provides a transistor structure including a substrate, a gate, a first dielectric layer, a first contact and a second contact. The gate is disposed on the substrate. The first dielectric layer is disposed on the substrate. The first dielectric layer covers a portion of a top surface of the gate. The first contact is electrically connected to the gate. The second contact is disposed on the first dielectric layer. The second contact is electrically connected with the first contact.

According to an embodiment of the invention, in the transistor structure, a material of the gate is doped polysilicon, for example.

According to an embodiment of the invention, in the transistor structure, the first dielectric layer can be a single layer structure or a multi-layer structure.

According to an embodiment of the invention, in the transistor structure, the single layer structure is an oxide layer, for example.

According to an embodiment of the invention, in the transistor structure, the multi-layer structure is an ONO layer, for example.

According to an embodiment of the invention, in the transistor structure, a material of the first contact is tungsten, for example.

According to an embodiment of the invention, in the transistor structure, a distance between a bottom of the second contact and the substrate is 50 nm or more, for example.

According to an embodiment of the invention, in the transistor structure, a material of the second contact is tungsten, for example.

According to an embodiment of the invention, the transistor structure can further include a second dielectric layer. The second dielectric layer is disposed between the gate and the substrate.

According to an embodiment of the invention, the transistor structure can further include a first doped region and a second doped region. The first doped region and the second doped region are respectively disposed in the substrate at one side and another side of the gate and have a first conductive type.

According to an embodiment of the invention, in the transistor structure, the first doped region can be located at one side of the first dielectric layer away from the gate.

According to an embodiment of the invention, the transistor structure can further include a third doped region. The third doped region is disposed in the substrate at the another side of the gate and has a second conductive type. The second doped region is located in the third doped region.

According to an embodiment of the invention, the transistor structure can further include a fourth doped region. The fourth doped region is disposed in the substrate and has the first conductive type. The first doped region, the second doped region and the third doped region are located in the fourth doped region.

According to an embodiment of the invention, in the transistor structure, the first conductive type is one of an N-type and a P-type, and the second conductive type is another one of the N-type and the P-type, for example.

According to an embodiment of the invention, the transistor structure can further include a third dielectric layer. The third dielectric layer covers the gate and the first dielectric layer. The first contact and the second contact are located in the third dielectric layer.

According to an embodiment of the invention, in the transistor structure, a material of the third dielectric layer is silicon oxide, silicon nitride or a combination thereof, for example.

Based on the above description, in the transistor structure, the first contact is electrically connected to the gate, the second contact is disposed on the first dielectric layer, and the second contact is electrically connected with the first contact. Therefore, the second contact can prevent the charge and the electric field from concentrating at the sharp edge or the sharp point of the transistor structure, and thus the leakage current of the transistor structure can be inhibited and the transistor structure can have the superior electrical performance.

In order to make the aforementioned and other objects, features and advantages of the present invention comprehensible, a preferred embodiment accompanied with figures is described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
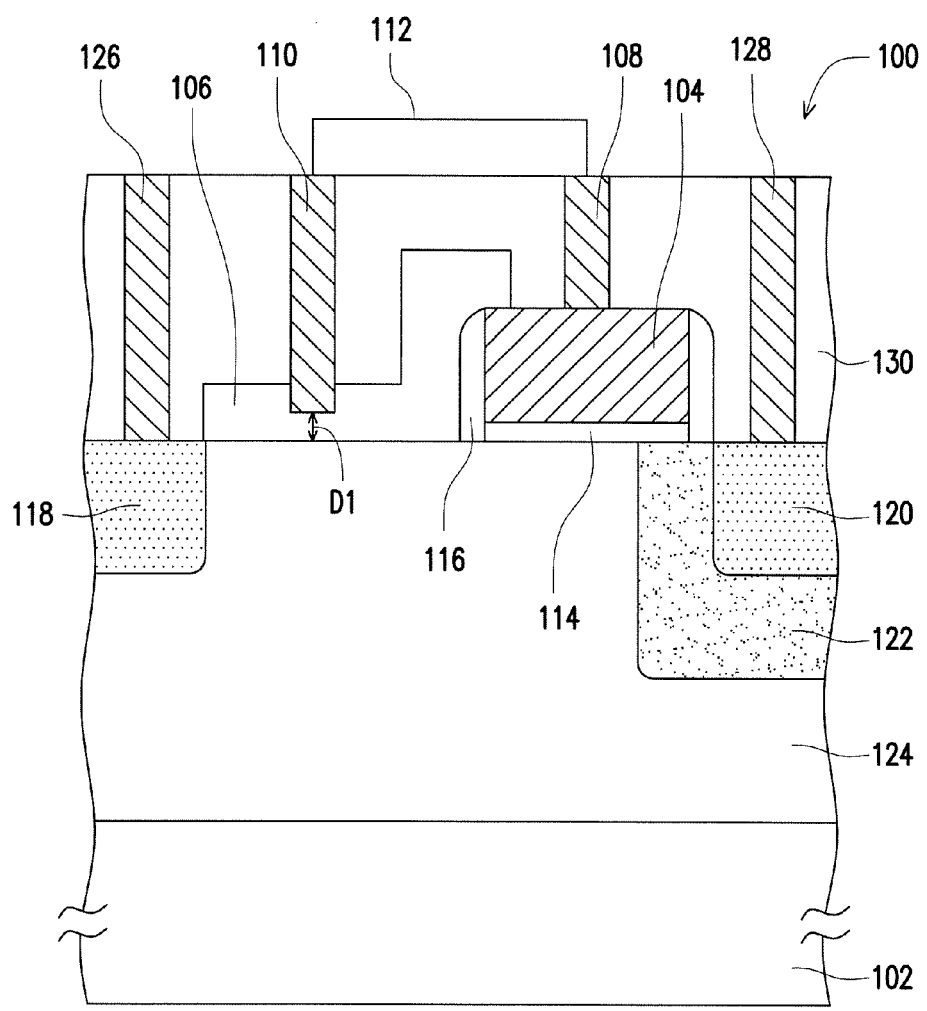
FIG. 1 is a cross-sectional view illustrating a transistor structure according to an embodiment of the invention.

FIG. 1 is a cross-sectional view illustrating a transistor structure according to an embodiment of the invention.

Referring to FIG. 1, a transistor structure 100 including a substrate 102, a gate 104, a dielectric layer 106, a contact 108 and a contact 110. The transistor structure 100 can be a high voltage transistor device. The high voltage transistor device is a lateral diffused metal-oxide semiconductor (LDMOS) device or a double diffused drain metal-oxide semiconductor (DDDMOS) device, for example. In this embodiment, the transistor structure 100 is exemplified as the LDMOS device, but the invention is not limited thereto.

The substrate 102 is a silicon substrate, for example. The gate 104 is disposed on the substrate 102. The material of the gate 104 is doped polysilicon, for example. The method for forming the gate 104 is a chemical vapor deposition (CVD) method, for example.

The dielectric layer 106 is disposed on the substrate 102. The dielectric layer 106 covers a portion of a top surface of the gate 104. The thickness of the dielectric layer 106 is 50 nm to 150 nm, for example. The dielectric layer 106 can be a single layer structure or a multi-layer structure. The single layer structure is an oxide layer, for example. The multi-layer structure is an ONO layer, for example. In this embodiment, the dielectric layer 106 is exemplified as the single layer structure, but the invention is not limited thereto. The method for forming the dielectric layer 106 is the CVD method, for example.

The contact 108 is electrically connected to the gate 104. The material of the contact 108 is tungsten, for example. The method for forming the contact 108 is a physical vapor deposition (PVD) method or the CVD method, for example.

The contact 110 is disposed on the dielectric layer 106. The contact 110 is electrically connected with the contact 108. The contact 110 can prevent the charge and the electric field from concentrating at the sharp edge or the sharp point of the transistor structure 100. The distance D1 between a bottom of the contact 110 and the substrate 102 is 50 nm or more, for example. The material of the contact 110 is tungsten, for example. The method for forming the contact 110 is the PVD method or the CVD method, for example. The contact 110 can be electrically connected with the contact 108 by an interconnect 112. The interconnect 112 includes a contact, a conductive line or a combination thereof.

Furthermore, the transistor structure 100 can further include at least one of a dielectric layer 114, a spacer 116, a doped region 118, a doped region 120, a doped region 122, a doped region 124, a contact 126, a contact 128 and a dielectric layer 130.

The dielectric layer 114 is disposed between the gate 104 and the substrate 102. The dielectric layer 114 can be used as gate dielectric layer. The material of the dielectric layer 114 is silicon oxide, for example. The method for forming the dielectric layer 114 is the CVD method or a thermal oxidation method, for example.

The spacer 116 is disposed on sidewalls of the gate 104. The material of the spacer 116 is silicon nitride, for example. The method for forming the spacer 116 can include following steps. A spacer material layer covering the gate 104 is formed first, and then an etching-back process is performed on the spacer material layer. Additionally, the dielectric layer 106 can cover the spacer 116.

The doped region 118 and the doped region 120 are respectively disposed in the substrate 102 at one side and another side of the gate 104 and have a first conductive type. One of the doped region 118 and the doped region 120 can be used as a source region, and the other one of the doped region 118 and the doped region 120 can be used as a drain region. The doped region 118 can be located at one side of the dielectric layer 106 away from the gate 104. The doped region 122 is disposed in the substrate 102 at the another side of the gate 104 and has a second conductive type. The doped region 120 is located in the doped region 122. The doped region 124 is disposed in the substrate 102 and has the first conductive type. The doped region 118, the doped region 120 and the doped region 122 are located in the doped region 124. The method for forming the doped region 118, the doped region 120, the doped region 122 and the doped region 124 is an ion implantation method, for example.

Moreover, the terms "first conductive type" and "second conductive type" used in this embodiment refer to different conductive types. The first conductive type is one of an N-type and a P-type, and the second conductive type is another one of the N-type and the P-type, for example. In this embodiment, the first conductive type is exemplified as the N-type, and the second conductive type is exemplified as the P-type, but the invention is not limited thereto.

The contact 126 and the contact 128 are electrically connected to the doped region 118 and the doped region 120 respectively. The material of the contact 126 and the contact 128 is tungsten, for example. The method for forming the contact 126 and the contact 128 is the PVD method or the CVD method, for example.

The dielectric layer 130 covers the gate 104 and the dielectric layer 106. The contact 108, the contact 110, the contact 126 and the contact 128 are located in the dielectric layer 130. The dielectric layer 130 can be a single layer structure or a multi-layer structure. In this embodiment, the dielectric layer 130 is exemplified as the single layer structure, but the invention is not limited thereto. The material of the dielectric layer 130 is silicon oxide, silicon nitride or a combination thereof, for example. The method for forming the dielectric layer 130 is the CVD method, for example.

Based on the aforementioned embodiment, in the transistor structure 100, the contact 108 is electrically connected to the gate 104, the contact 110 is disposed on the dielectric layer 106, and the contact 110 is electrically connected with the contact 108. Therefore, the contact 110 can prevent the charge and the electric field from concentrating at the sharp edge or the sharp point of the transistor structure 100, and thus the leakage current of the transistor structure 100 can be inhibited and the transistor structure 100 can have the superior electrical performance.

Figure 2:
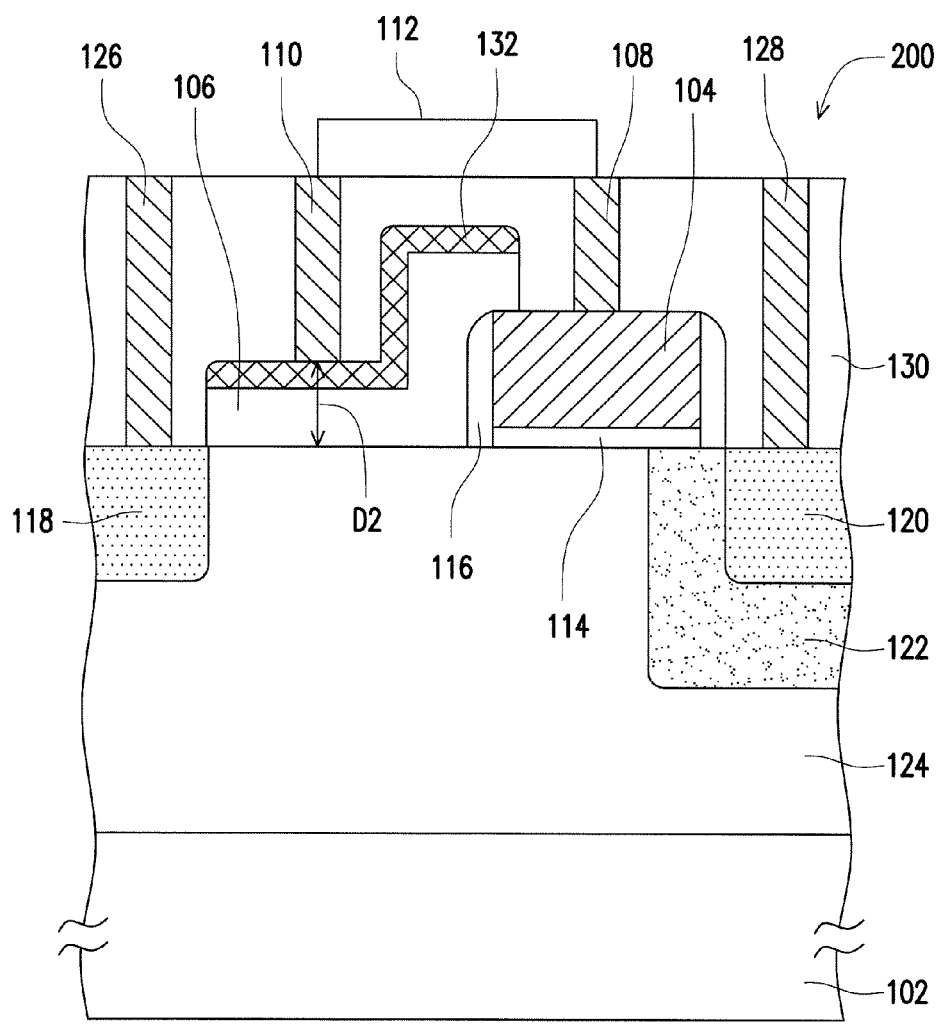
FIG. 2 is a cross-sectional view illustrating a transistor structure according to another embodiment of the invention.

FIG. 2 is a cross-sectional view illustrating a transistor structure according to another embodiment of the invention.

Referring to FIG. 1 and FIG. 2, a difference between the embodiments of FIG. 1 and FIG. 2 is described as follows. The transistor structure 200 can further include an etch stop layer 132. The etch stop layer 132 is disposed on the dielectric layer 106. The contact 110 is disposed on the etch stop layer 132. The distance D2 between the bottom of the contact 110 and the substrate 102 is 50 nm or more, for example. The thickness of the etch stop layer 132 is 20 nm to 100 nm, for example. The material of the etch stop layer 132 is polysilicon, for example. The polysilicon can be undoped polysilicon or doped polysilicon. The etch stop layer 132 can be used as a filed plate when the material of the etch stop layer 132 is the polysilicon (for example, doped polysilicon or undoped polysilicon) and the filed plate is capable of further reducing the electric field. Components of the transistor structure 200 of FIG. 2 that are similar to those of the transistor structure 100 of FIG. 1 are assigned with the same reference numerals and detailed description thereof is omitted here.

In summary, in the transistor structures 100 and 200 of the aforementioned embodiments, the contact 110 can prevent the charge and the electric field from concentrating at the sharp edge or the sharp point of the transistor structures 100 and 200, and thus the leakage current of the transistor structures 100 and 200 can be inhibited and the transistor structures 100 and 200 can have the superior electrical performance.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A transistor structure comprising:
    a gate disposed on a substrate;
    a first dielectric layer disposed on the substrate, wherein the first dielectric layer covers a portion of a top surface of the gate;
    a first contact electrically connected to the gate; and
    a second contact disposed on the first dielectric layer, wherein the second contact is electrically connected with the first contact.

2. The transistor structure of claim 1, wherein a distance between a bottom of the second contact and the substrate is 50 nm or more.

3. The transistor structure of claim 1, further comprising a second dielectric layer disposed between the gate and the substrate.

4. The transistor structure of claim 1, wherein a material of the first contact comprises tungsten.

5. The transistor structure of claim 1, wherein a material of the gate comprises doped polysilicon.

6. The transistor structure of claim 1, wherein a material of the second contact comprises tungsten.

7. The transistor structure of claim 1, wherein the first dielectric layer comprises a single layer structure or a multi-layer structure.

8. The transistor structure of claim 7, wherein the single layer structure comprises an oxide layer.

9. The transistor structure of claim 7, wherein the multi-layer structure comprises an ONO layer.

10. The transistor structure of claim 1, further comprising a third dielectric layer covering the gate and the first dielectric layer, wherein the first contact and the second contact are located in the third dielectric layer.

11. The transistor structure of claim 10, wherein a material of the third dielectric layer comprises silicon oxide, silicon nitride or a combination thereof.

12. The transistor structure of claim 1, further comprising a first doped region and a second doped region respectively disposed in the substrate at one side and another side of the gate and having a first conductive type.

13. The transistor structure of claim 12, wherein the first doped region is located at one side of the first dielectric layer away from the gate.

14. The transistor structure of claim 12, further comprising a third doped region disposed in the substrate at the another side of the gate and having a second conductive type, wherein the second doped region is located in the third doped region.

15. The transistor structure of claim 14, further comprising a fourth doped region disposed in the substrate and having the first conductive type, wherein the first doped region, the second doped region and the third doped region are located in the fourth doped region.

16. The transistor structure of claim 15, wherein the first conductive type is one of an N-type and a P-type, and the second conductive type is another one of the N-type and the P-type.

* * * * *